(12) United States Patent
Fu et al.

(10) Patent No.: US 7,371,629 B2
(45) Date of Patent: May 13, 2008

(54) N/PMOS SATURATION CURRENT, HCE, AND VT STABILITY BY CONTACT ETCH STOP FILM MODIFICATIONS

(75) Inventors: Chu-Yun Fu, Taipei (TW); Chi-Hsun Hsieh, Changhua (TW); Yi-Ming Sheu, Hsin Chu (TW); Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 590 days.

(21) Appl. No.: 10/314,689

(22) Filed: Dec. 9, 2002

(65) Prior Publication Data

US 2004/0110392 A1    Jun. 10, 2004

(51) Int. Cl.
*H01L 21/8237* (2006.01)
(52) U.S. Cl. .................. 438/199; 438/197; 438/229; 438/E21.269; 438/E21.393
(58) Field of Classification Search ........ 438/197–199, 438/223–229, 719–724
See application file for complete search history.

(56) References Cited

U.S. PATENT DOCUMENTS

| | | | |
|---|---|---|---|
| 4,563,367 A | 1/1986 | Sherman | 427/39 |
| 5,731,238 A | 3/1998 | Cavins et al. | 438/261 |
| 5,897,372 A | 4/1999 | Howard | 438/637 |
| 6,017,784 A * | 1/2000 | Ohta et al. | 438/197 |
| 6,284,583 B1 | 9/2001 | Saida et al. | 438/216 |
| 6,372,569 B1 * | 4/2002 | Lee et al. | 438/229 |
| 6,372,672 B1 | 4/2002 | Kim et al. | 438/791 |
| 6,451,704 B1 * | 9/2002 | Pradeep et al. | 438/719 |
| 6,573,172 B1 * | 6/2003 | En et al. | 438/626 |
| 6,635,576 B1 * | 10/2003 | Liu et al. | 438/700 |
| 6,706,576 B1 * | 3/2004 | Ngo et al. | 438/197 |
| 7,052,989 B2 * | 5/2006 | Ichihashi et al. | 438/637 |
| 2001/0001075 A1 * | 5/2001 | Ngo et al. | 438/257 |

* cited by examiner

*Primary Examiner*—Dung A. Le
(74) *Attorney, Agent, or Firm*—Haynes Boone, LLP

(57) ABSTRACT

A method is provided for improving Idsat in NMOS and PMOS transistors. A silicon nitride etch stop layer is deposited by a PECVD technique on STI and silicide regions and on sidewall spacers during a MOSFET manufacturing scheme. A dielectric layer is formed on the nitride and then contact holes are fabricated through the dielectric layer and nitride layer to silicide regions and are filled with a metal. For NMOS transistors, silane and $NH_3$ flow rates and a 400° C. temperature are critical in improving NMOS short channel Idsat. Hydrogen content in the nitride is increased by higher $NH_3$ and $SiH_4$ flow rates but does not significantly degrade HCE and Vt. With PMOS transistors, deposition temperature is increased to 550° C. to reduce hydrogen content and improve HCE and Vt stability.

14 Claims, 5 Drawing Sheets

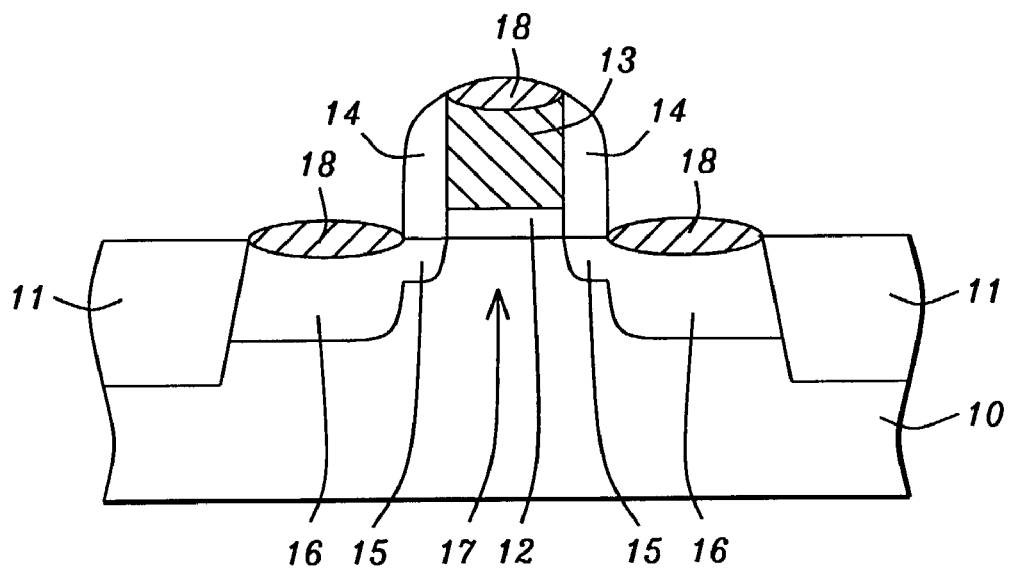
FIG. 1 – Prior Art
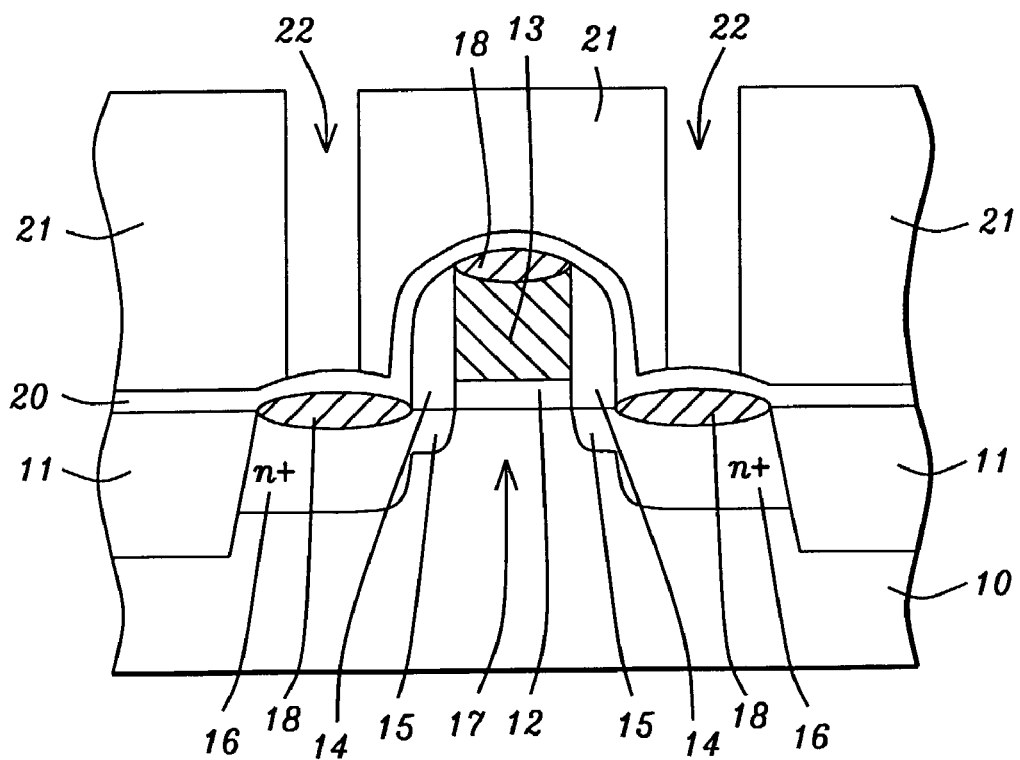
FIG. 2

N/PMOS SATURATION CURRENT, HCE, AND VT STABILITY BY CONTACT ETCH STOP FILM MODIFICATIONS

FIELD OF THE INVENTION

The invention relates to a method of fabricating an integrated circuit in a semiconductor device. More particularly, the present invention is directed to improving the reliability and performance of NMOS and PMOS transistors.

BACKGROUND OF THE INVENTION

As technology advances into the regime of sub-100 nm gate lengths in order to increase transistor speed in MOSFET (Metal Oxide Semiconductor Field Effect Transistor) devices, there is a need to improve the reliability and performance of n-type (hereafter called NMOS) and p-type (hereafter called PMOS) transistors. A typical MOSFET is shown in FIG. 1 and is comprised of a substrate 10 with insulating regions 11 that separate active areas upon which a gate oxide 12 and a gate electrode 13 are formed. A cap layer (not shown) is optional above gate electrode 13 which is also referred to as a gate conductor layer. Sidewall spacers 14 are adjacent to gate electrode 13. Source/drain regions comprised of lightly doped 15 and heavily doped 16 regions are located on either side of a channel region 17. Typically, a silicide layer 18 is formed above the gate electrode 13 and above source/drain regions 16.

When the device design shrinks to provide faster transistors, the gate length (width of gate electrode 13) and channel length become shorter. One effect of a shorter channel is a hot carrier effect (HCE) that occurs when electrons introduced to a strong electric field near the drain region 16 generate hot carriers that can accumulate in the gate oxide 12. A build up of hot carriers can cause changes in the threshold voltage (Vt) and reduce the reliability of the MOSFET. Therefore, a need exists to reduce the hot carrier lifetime and improve Vt stability.

Silicon nitride is often used as an etch stop layer in device fabrication. For example, a layer of silicon nitride is deposited on a substrate and a dielectric layer is formed over the nitride layer. Then contact holes are etched into the dielectric layer and stop on the nitride because of a high etch selectivity toward an oxide based dielectric layer. Etch selectivity of silicon nitride relative to oxide is higher than silicon oxynitride relative to oxide. When the substrate in the aforementioned structure is a MOS transistor and interconnects are subsequently formed to the source/drain regions and to the gate electrode through the dielectric layer and nitride, care must exercised in depositing the nitride. Otherwise, hot carrier lifetime and Vt stability are significantly degraded compared to results obtained with silicon oxynitride as the etch stop. Silicon nitride tends to have a high hydrogen content that passivates dangling bonds between the Si/SiO$_2$ interface. However, the Si—H bonds formed at the interface can easily be broken during HCE and Vt stress which leads to a longer HCE lifetime and poorer Vt stability. Therefore, an improved method of forming a silicon nitride etch stop layer is required to improve reliability and N/PMOS performance, especially saturated drain current (Idsat).

U.S. Pat. No. 6,372,672 describes a PECVD method of depositing a silicon nitride layer that exhibits good stress characteristics during thermal processing. A combination of SiH$_4$, NH$_3$, and N$_2$ is employed with a SiH$_4$/NH$_3$ ratio of from 2:1 to 1:3. The flow rates, RF power, and chamber pressure are controlled to give a composition of Si$_3$N$_{3.75}$H$_{0.25}$ which is lower in hydrogen content than the conventional nitride film that is about Si$_3$N$_{3.33}$H$_{0.67}$. The process deposits a nitride layer at a rate of 1500 Angstroms per minute.

In contrast to the high rate of deposition cited in the previous case, U.S. Pat. No. 5,731,238 describes a jet vapor deposition (JVD) of silicon nitride without a hydrogen containing nitride source gas at a rate of between 3 and 10 Angstroms per minute. The resulting JVD nitride has a hydrogen content of less than 10 atomic % compared to 20 to 30 atomic % in conventional silicon nitride layers. Stress induced leakage current in non-volatile memory cells is reduced.

U.S. Pat. No. 6,284,583 mentions formation of a silicon nitride film by a low pressure CVD process involving SiCl$_4$ and ammonia. The hydrogen density per unit area is less than $1 \times 10^{15}$ cm$^{-2}$ and the layer is substantially free of Si—H bonds. The nitride layer serves as a capacitor insulating film and leakage current is suppressed when hydrogen density is minimized.

Related art in U.S. Pat. No. 4,563,367 describes an apparatus and method for forming silicon nitride films in a plasma assisted CVD process. The process involves SiH$_4$, NH$_3$, and N$_2$ and provides a deposition rate of 300 to 400 Angstroms per minute.

In one example found in U.S. Pat. No. 6,372,569, a hydrogen rich silicon nitride layer is formed over a NMOS transistor. A dielectric layer which is subsequently deposited on the nitride is densified at 600° C. to 800° C. to drive the hydrogen in the nitride layer into an underlying source/drain region to improve the saturated drain current (Idsat).

Another modification of a silicon nitride layer is found in U.S. Pat. No. 5,897,372 where a silicon rich nitride is used as a protective layer in self aligned etching. The conformal silicon rich nitride has a higher resistance to a fluorocarbon etch than conventional nitride because less nitrogen is present in the film to react with and remove a protective carbon build up that is formed during the etch.

SUMMARY OF INVENTION

One objective of the present invention is to provide a means of improving saturated drain current (Idsat) in a short channel NMOS transistor without significantly degrading hot carrier lifetime and threshold voltage (Vt) stability.

A further objective of the present invention is to provide a method of increasing Idsat in a short channel PMOS transistor while improving hot carrier lifetime and Vt stability.

A still further objective of the present invention is to provide a method of improving saturated drain current that utilizes existing materials and equipment so that a low cost process can be implemented readily in manufacturing.

These objectives are accomplished in one embodiment by providing a substrate with isolation regions such as shallow trench isolation (STI) structures and an NMOS transistor formed between the isolation regions. A conformal silicon nitride layer is deposited by a PECVD process that involves a SiH$_4$ silicon source gas with a flow rate of from 60 to 150 standard cubic centimeters per minute (sccm), a NH$_3$ flow rate of from 20 to 50 sccm and a N$_2$ flow rate of between 2000 and 5000 sccm. The chamber pressure of about 2 to 6 Torr is lower than related art and the silane flow rate is higher than in prior art. A dielectric layer selected from a group including SiO$_2$, carbon doped SiO$_2$, polyarylethers, polysilsesquioxanes, polyimides, fluorosilicate glass, and other low k dielectric materials is deposited on the silicon nitride layer. Contact holes are formed by conventional means and extend through the dielectric layer. The etch stop exposed by the contact holes is removed and a metal is deposited to form a contact to the silicide regions of the NMOS transistor. A planarization technique such as chemical mechanical polishing (CMP) is used to make the metal coplanar with the dielectric layer. In this manner, the Idsat for the device is improved by at least 4 to 5%.

In a second embodiment, a substrate is provided with isolation regions and a PMOS transistor formed between said regions. A conformal silicon nitride layer is deposited by a PECVD process that involves a $SiH_4$ silicon source gas with a flow rate of from 50 to 120 standard cubic centimeters per minute (sccm), a $NH_3$ flow rate of from 0 to 80 sccm and a $N_2$ flow rate of between 6000 and 9500 sccm. The process temperature is elevated to about 550° C. during nitride deposition to decrease the hydrogen content in the nitride layer. A dielectric layer selected from a group including $SiO_2$ or phosphorous doped $SiO_2$ is deposited on the silicon nitride layer. Contact holes are formed by conventional means and extend through the dielectric layer. The etch stop exposed by the contact holes is removed and a metal is deposited to form a contact to the silicide regions of the PMOS transistor. A planarization technique such as chemical mechanical polishing (CMP) is used to make the metal coplanar with the dielectric layer. In this manner, the Idsat for the device is improved by at least 10%.

BRIEF DESCRIPTION OF THE DRAWINGS

FIG. 1 depicts a prior art example of a MOSFET with lightly and heavily doped source/drain regions, sidewall spacer, and a silicide layer.

FIGS. 2-5 are cross-sectional views of an NMOS transistor in which metal interconnects are formed through contact holes above a silicide layer in accordance with one embodiment of the present invention.

DETAILED DESCRIPTION OF THE INVENTION

Figure 3:
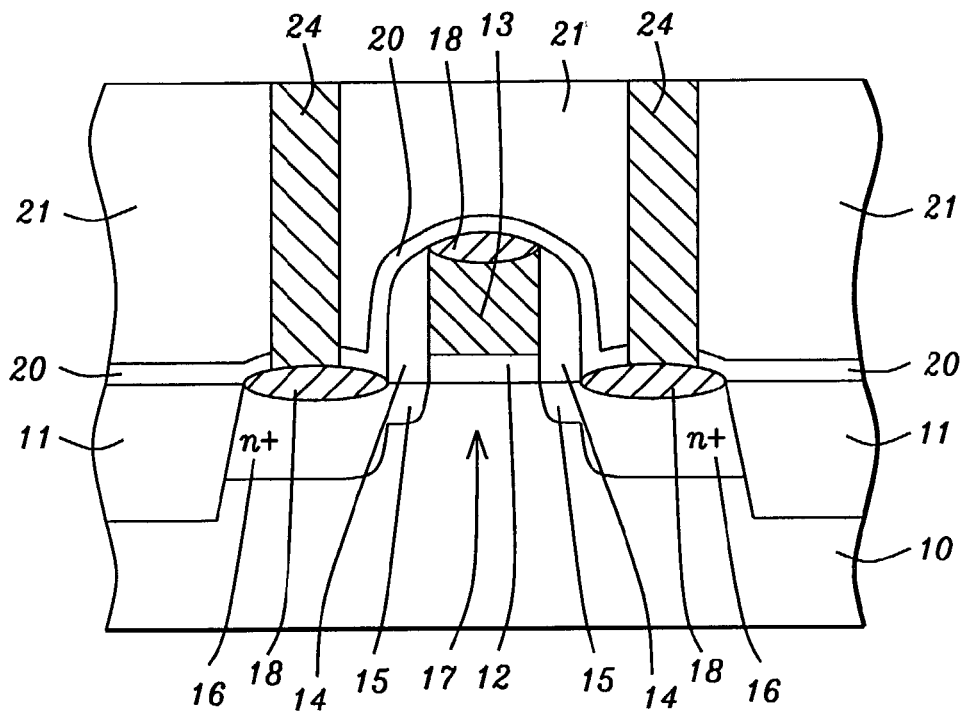

The present invention is a method of improving the reliability and performance of NMOS and PMOS transistors in a semiconductor device. The invention is not limited to the specific examples described herein and the figures are not necessarily drawn to scale.

The first embodiment is illustrated in FIGS. 2-5. Referring to FIG. 2, a substrate 10 is provided that is typically silicon and is comprised of active and passive devices in a substructure (not shown). An NMOS transistor is fabricated by conventional means between shallow trench isolation (STI) features 11 that are filled with a dielectric material such as $SiO_2$. The NMOS transistor is comprised of a gate dielectric layer 12 such as $SiO_2$, a gate electrode 13 which is normally polysilicon or amorphous silicon, sidewall spacers 14, lightly doped source/drain regions 15, heavily doped source/drain regions 16, channel 17, and silicide regions 18.

The NMOS transistor is further defined according to the present invention by forming a conformal etch stop layer 20 on STI regions 11, silicide regions 18, and on sidewall spacers 14. Etch stop layer 20 is preferably comprised of silicon nitride that is deposited to a thickness of between 200 and 600 Angstroms by a plasma enhanced chemical vapor deposition (PECVD) technique. The process conditions for the nitride deposition are a key aspect of the invention and include a chamber temperature between about 350° C. and 450° C., a chamber pressure of about 2 to 6 Torr, a RF power of from 300 to 450 Watts, a $SiH_4$ flow rate of 60 to 150 standard cubic centimeters per minute (sccm), a $NH_3$ flow rate of about 20 to 50 sccm, and a $N_2$ flow rate of between 2000 and 5000 sccm. A silane flow rate of from 110 to 150 sccm is an acceptable alternative range and is equally effective in providing the desired benefits of the invention. Likewise, a chamber pressure of from 2 to 4 Torr is an acceptable alternative range that provides the same benefits as the wider range described above. By employing a high $NH_3$ or $SiH_4$ flow in a 350° C. to 450° C. temperature range, hydrogen content is increased slightly to 20 to 25 atomic % in the silicon nitride 20. As a result of the higher hydrogen content, Idsat is increased. A low chamber pressure is desirable because of better etch stop coverage for dense design rules. The rate of nitride deposition is between about 2000 and 3000 Angstroms per minute.

The inventors have found that temperature of the conformal silicon nitride 20 deposition is also critical in optimizing saturated drain current (Idsat). A temperature in the 350° C. to 450° C. range Is preferred to achieve the highest H content and highest Idsat. When the deposition temperature is greater than 500° C., H content is decreased and the optimal Idsat is not reached.

A dielectric layer 21 that is selected from a group of materials including $SiO_2$ and phosphorous doped $SiO_2$ is deposited by a CVD method. Dielectric layer 21 has a thickness in the range of about 4500 to 7000 Angstroms after a CMP planarization step.

Contact holes 22 are formed in dielectric layer 21 by conventional means that typically involves patterning a photoresist layer (not shown) and using the photoresist as an etch mask for transferring the pattern through the dielectric layer 21. In this case, holes 22 are formed above silicide regions 18 that are on source/drain regions 16. Generally, contact holes 22 have a width that is between about 50 and 200 nm. Preferably, the contact hole 22 width is smaller than the width of silicide regions 18 in order to allow for some alignment error while patterning the holes 22 in the photoresist layer. The etch through layer 21 continues until stopping on silicon nitride layer 20 when nitride is detected in the effluent gas from the etch chamber. Nitride 20 has a lower etch rate than dielectric layer 21 in the etchant that transfers holes 22 through layer 21. Therefore, only a small thickness of nitride 20 is removed during the dielectric layer 21 etch step.

Referring to FIG. 3, nitride layer 21 that has been exposed by formation of holes 22 is then removed by a process comprised of fluorine containing gases. This step is usually followed by a cleaning process such as a $H_2SO_4/H_2O_2$ (SPM) treatment or SPM followed by a $NH_4OH/H_2O_2$ (APM) treatment to ensure that no residues remain on silicide layers 18 that are exposed by removal of nitride layer 21 in contact holes 22.

A barrier metal liner such as TiN, WN, TaN, or TaSiN is deposited in contact holes 22 and then a metal 24 that is preferably Cu or W is deposited by an evaporating, electroplating, or CVD technique to fill contact holes 22. A planarizing method such as chemical mechanical polishing is employed to make metal layer 24 coplanar with dielectric layer 21.

Figure 4:
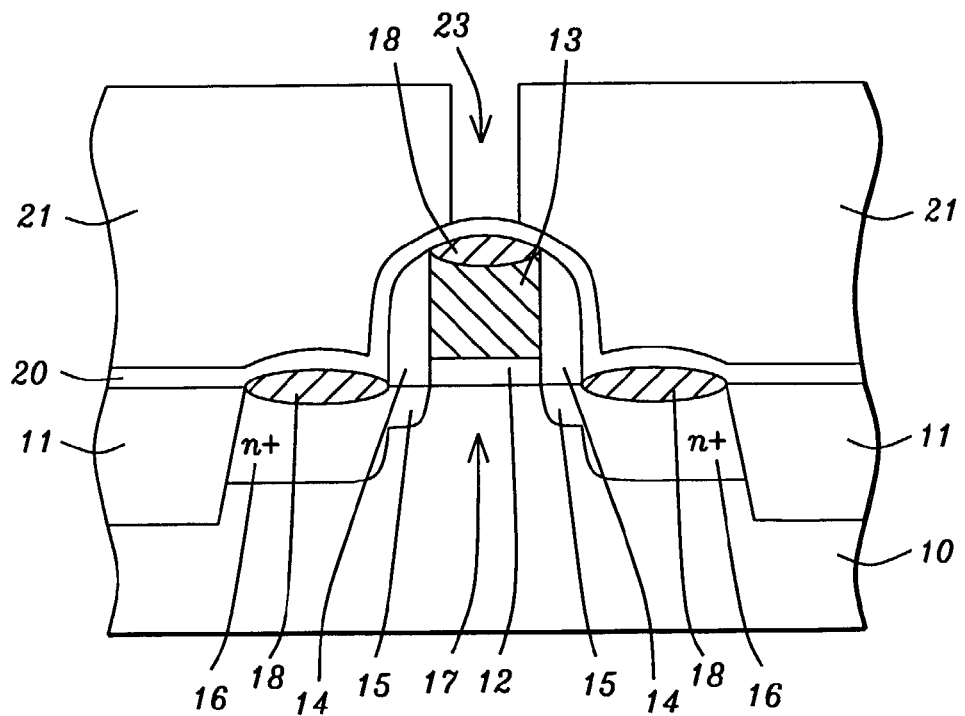
Figure 5:
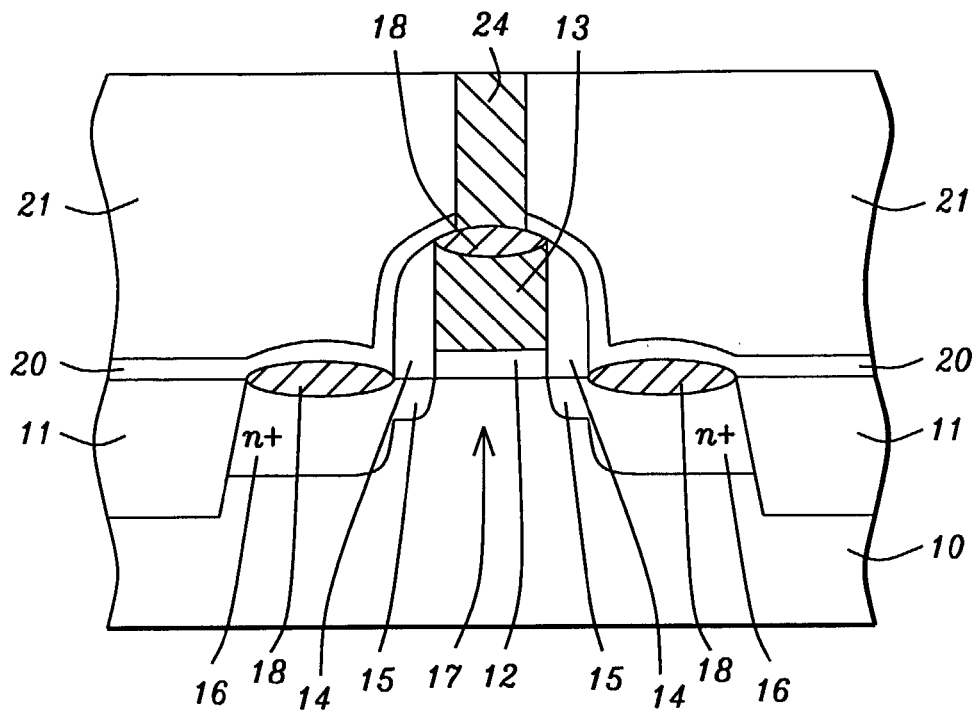

As shown in FIG. 4, an alternate placement of a contact hole in dielectric layer 21 that depends on layout and design is to pattern an overlying photoresist (not shown) such that a contact hole 23 is formed over a silicide region 18 above gate electrode 13. In FIG. 5, the contact hole 23 is etch transferred through dielectric layer 21 and nitride layer 20 and filled with a metal 24 as described previously for contact holes 22.

In either case of contact hole 22, 23 placement, an improvement of at least 4 to 5% in Idsat for the NMOS transistor is achieved while not significantly degrading HCE and Vt stability. The improved method makes use of existing tools and materials and therefore can be readily implemented in manufacturing.

Figure 6:
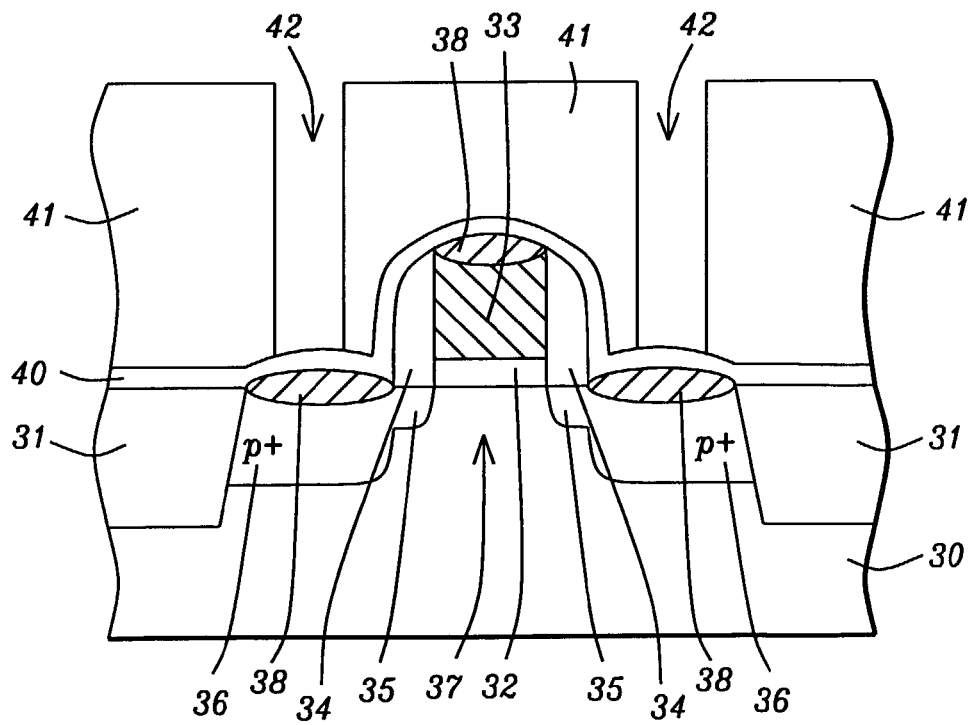
FIGS. 6-9 are cross-sectional views of a PMOS transistor in which metal interconnects are formed through contact holes above a silicide layer in accordance with a second embodiment of the present invention.

A second embodiment is illustrated in FIGS. 6-9. Referring to FIG. 6, a substrate 30 is provided that is typically silicon and is comprised of active and passive devices in a substructure (not shown). A PMOS transistor is fabricated by conventional means between shallow trench isolation (STI) features 31 that are filled with a dielectric material such as $SiO_2$. The PMOS transistor is comprised of a gate dielectric layer 32 such as $SiO_2$, a gate electrode 33 that is normally polysilicon or amorphous silicon, sidewall spacers 34, lightly doped source/drain regions 35, heavily doped source/drain regions 36, channel 37, and silicide regions 38.

The PMOS transistor is further defined according to the present invention by forming a conformal etch stop layer 40 on STI regions 31, silicide regions 38, and on spacers 34. Etch stop layer 40 is preferably comprised of silicon nitride that is deposited to a thickness of between 200 and 600 Angstroms by a PECVD technique. The process conditions for the nitride deposition are a key aspect of the invention and include a chamber temperature between about 500° C. and 600° C., a chamber pressure of about 2 to 6 Torr, a RF power of from 350 to 450 Watts, a $SiH_4$ flow rate of 50 to 120 sccm, a $NH_3$ flow rate of about 0 to 80 sccm, and a $N_2$ flow rate of between 6000 and 9500 sccm. A silane flow rate of from 110 to 120 sccm is an acceptable alternative range and is equally effective in providing the desired benefits of the invention. Similarly, a $NH_3$ flow rate between 0 and about 10 sccm is an acceptable alternative range for this process. A lower $NH_3$ flow rate helps to reduce the hydrogen content in the nitride layer 40. Likewise, a chamber pressure of from 2 to 4 Torr is an acceptable alternative range that provides the same benefits as the wider range described above. A low chamber pressure is desirable because of better etch stop coverage for dense design rules.

The rate of nitride deposition is between about 600 and 1500 Angstroms per minute. The inventors have found that depositing nitride 40 at a high deposition temperature in the range of 500° C. to 600° C. results in lowering the hydrogen content and improves HCE and Vt stability. Furthermore, the method provides for a narrow width Idsat.

A dielectric layer 41 that is selected from a group of materials including $SiO_2$ and phosphorous doped $SiO_2$ is deposited by a CVD method. Dielectric layer 41 has a thickness in the range of about 4500 to 7000 Angstroms after a conventional CMP step to planarize layer 41.

Contact holes 42 are formed in dielectric layer 41 by conventional means that typically involves patterning a photoresist layer (not shown) and using the photoresist as an etch mask for transferring the pattern through the dielectric layer 41. In this case, holes 42 are formed above silicide regions 38 that are on source/drain regions 36. Generally, contact holes 42 have a width that is between about 50 and 200 nm. Preferably, the contact hole 42 width is smaller than the width of silicide regions 38 in order to allow for some alignment error while patterning the holes 42 in the photoresist layer. The etch through layer 41 continues until stopping on silicon nitride layer 40 when nitride is detected in the effluent gas from the etch chamber. Nitride 40 has a lower etch rate than dielectric layer 41 in the etchant that transfers holes 42 through layer 41. Therefore, only a small thickness of nitride 40 is removed during the dielectric layer 41 etch step.

Figure 7:
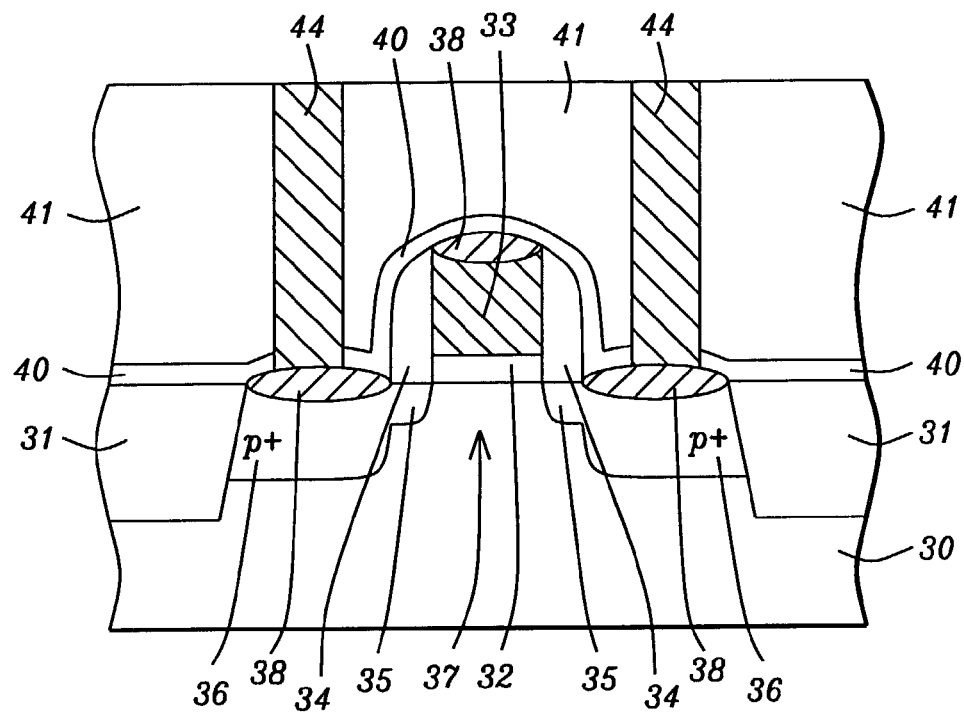

Referring to FIG. 7, nitride layer 41 that has been exposed by formation of holes 42 is then removed by a plasma etch process comprised of one or more fluorine containing gases. This step is usually followed by a cleaning process practiced by those skilled in the art such as SPM or SPM in combination with APM to ensure that no residues remain on silicide layers 38 that are exposed by removal of nitride layer 41 at the bottom of contact holes 42.

A metal 44 such as Cu or W is deposited by an evaporating, electroplating, or CVD technique to fill contact holes 42. A planarizing method such as chemical mechanical polishing is employed to make metal layer 44 coplanar with dielectric layer 41.

Figure 8:
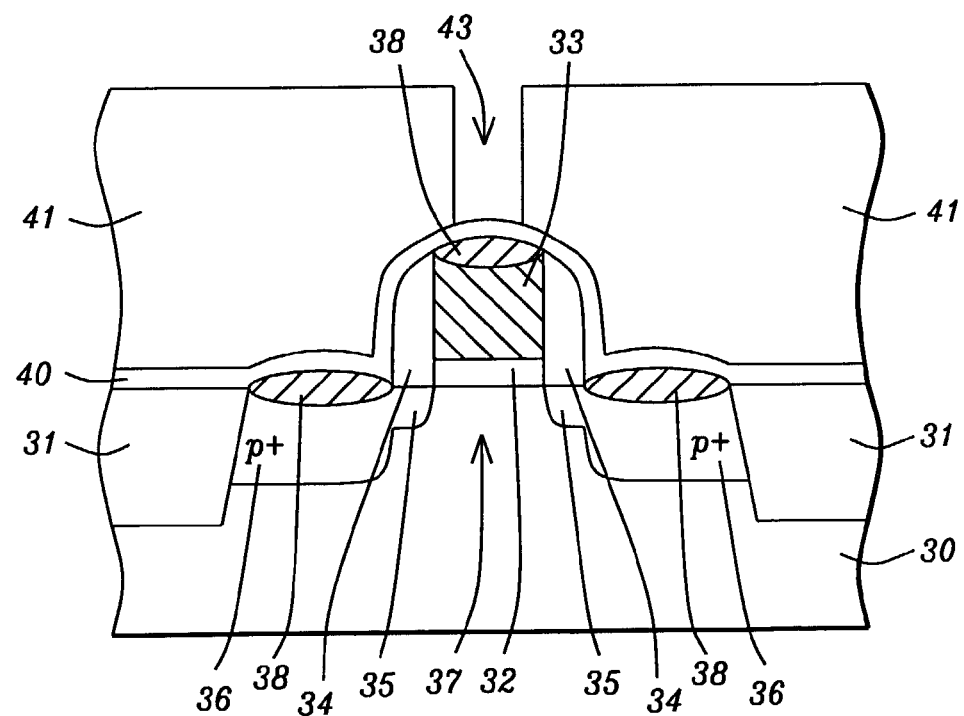
Figure 9:
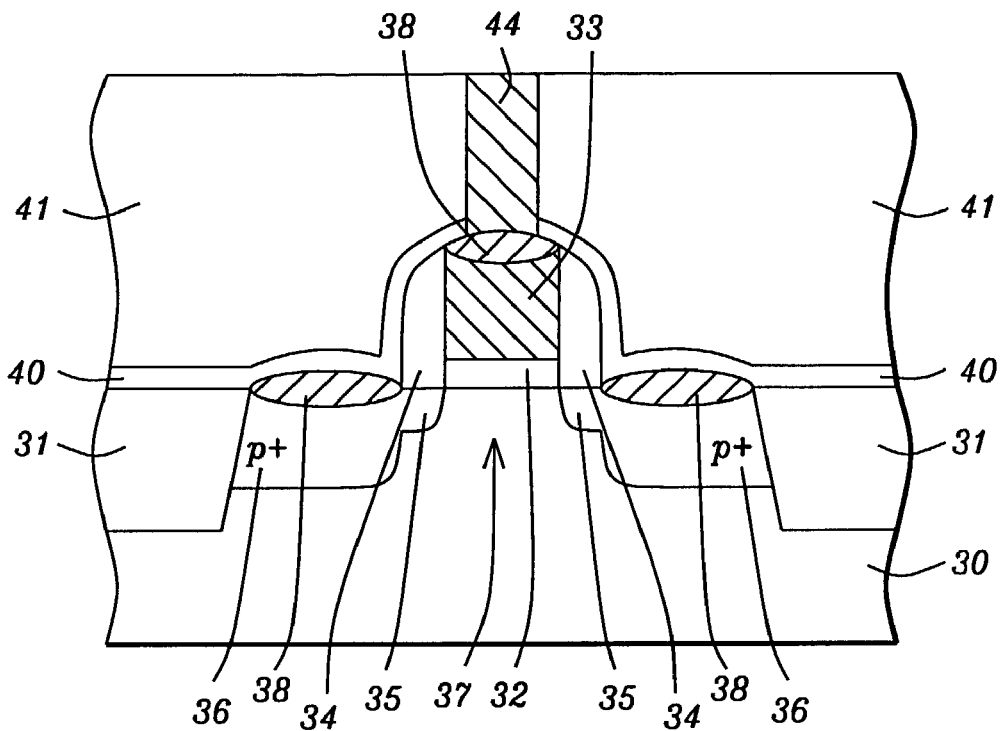

As shown in FIG. 8, an alternate placement of a contact hole in dielectric layer 41 that depends on layout and design is to pattern an overlying photoresist (not shown) such that a contact hole 43 is formed over a silicide region 38 above gate electrode 33. In FIG. 9, the contact hole 43 is etch transferred through dielectric layer 41 and nitride layer 40 and filled with a metal layer 44 as described previously for contact holes 42.

Figure 10:
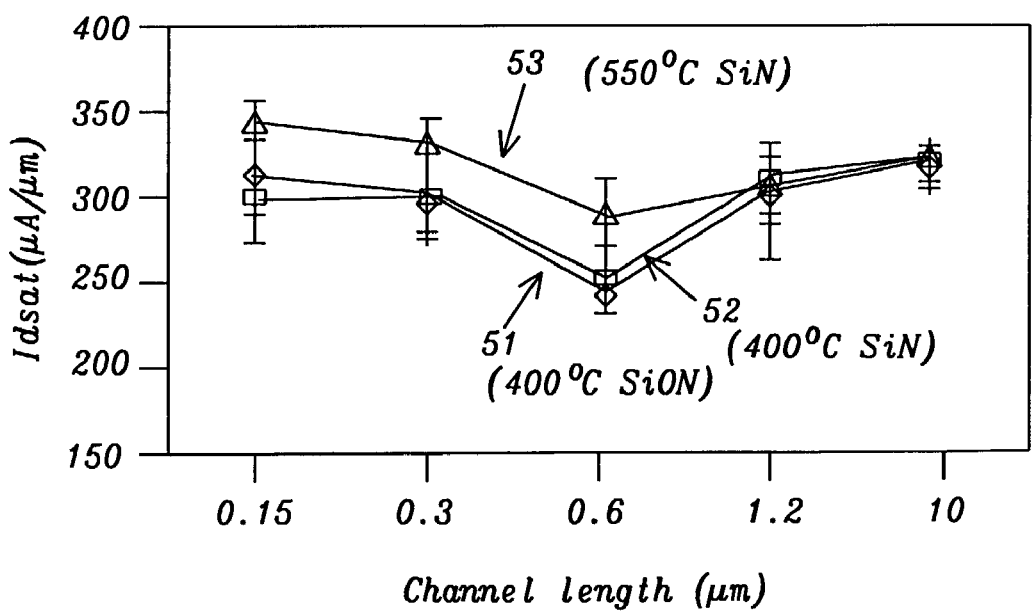
FIG. 10 is a plot showing the improvement in Idsat for a PMOS transistor that is processed with a method according to this invention.

In either case of contact hole 42, 43 placement, an improvement is provided as shown in FIG. 10 in which a plot of channel length in microns vs. Idsat in (uA/micron) is shown for a PMOS transistor. Line 51 that connects diamond symbols represents the results when silicon oxynitride is deposited at 400° C. as etch stop layer 40 in FIGS. 6-9. The inventors have found that silicon oxynitride as etch stop layer 40 is less desirable than a silicon nitride layer 40 which is deposited at 550° C. Line 53 which connects triangle symbols shows the Idsat following a 550° C. silicon nitride process. Line 52 which connects square symbols represents a 400° C. silicon nitride deposition process. For narrow channel lengths 37 defined as channel lengths below approximately 1 um in size, the 550° C. silicon nitride process consistently provides a 10% or higher improvement in narrow width PMOS Idsat. Furthermore, an improvement in HCE and Vt stability is achieved. The improved method makes use of existing tools and materials and therefore can be readily implemented in manufacturing.

While this invention has been particularly shown and described with reference to, the preferred embodiment thereof, it will be understood by those skilled in the art that various changes in form and details may be made without departing from the spirit and scope of this invention.

We claim:

1. A method of creating an integrated circuit device comprising:

providing a substrate wherein said substrate comprises isolation regions and active regions;

forming a transistor on said active regions, said transistor is comprised of a silicide region over a gate electrode and silicide regions over heavily doped source/drain regions;

forming a silicon nitride layer on said transistor and isolation regions with a PECVD technique;

depositing a dielectric layer on said silicon nitride;

forming one or more contact holes in said dielectric layer and in said nitride layer; and filling said holes with a metal layer to further define said transistor, wherein the channel length between said source/drain regions is less than about 1 micron wherein said transistor is an NMOS transistor, and said silicon nitride is hydrogen rich and deposited with a gas mixture comprised of a SiH4 silicon source gas and NH3 and N2 as nitride source gases.

2. The method of claim 1 wherein said silicon nitride layer is deposited to a give a conformal coating with a thickness between about 200 and 600 Angstroms.

3. The method of claim 1 wherein said SiH4 is flowed at a rate between about 60 and 150 sccm.

4. The method of claim 1 wherein SiH4 is flowed at a rate between about 110 and 150 sccm.

5. The method of claim 1 wherein said NH3 is flowed at a rate between about 20 and 50 sccm.

6. The method of claim 1 wherein said N2 is flowed at a rate from about 2000 to 5000 sccm.

7. The method of claim 1 wherein said PECVD method has a chamber temperature between about 350° C. and 450° C.

8. The method of claim 1 wherein said PECVD method has a chamber pressure from about 2 to 6 Torr and a RF power from about 300 to 450 Watts.

9. The method of claim 1 wherein said PECVD method has a chamber pressure from about 2 to 4 Torr and a RF power from about 300 to 450 Watts.

10. The method of claim 1 wherein said dielectric layer is selected from a group of materials including SiO2 and phosphorous doped SiO2.

11. The method of claim 1 wherein said contact hole is aligned above a silicide region that is on a heavily doped source/drain region or is above a silicide region that is on a gate electrode.

12. The method of claim 1 wherein said contact holes have a width from about 50 to 200 nm.

13. The method of claim 1 wherein said transistor is a PMOS transistor and said silicon nitride is deposited with a gas mixture comprised of a SiH4 silicon source gas and NH3 and N2 as nitride source gases.

14. The method of claim 1 wherein said dielectric layer has a thickness between about 4500 and 7000 Angstroms after a planarization step.

* * * * *